United States Patent
Plat et al.

(10) Patent No.: US 6,818,141 B1
(45) Date of Patent: Nov. 16, 2004

(54) APPLICATION OF THE CVD BILAYER ARC AS A HARD MASK FOR DEFINITION OF THE SUBRESOLUTION TRENCH FEATURES BETWEEN POLYSILICON WORDLINES

(75) Inventors: Marina V. Plat, San Jose, CA (US); Kouros Ghandehari, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 172 days.

(21) Appl. No.: 10/166,135

(22) Filed: Jun. 10, 2002

(51) Int. Cl.[7] .............................................. H01L 21/00
(52) U.S. Cl. .......................... 216/67; 216/17; 216/41; 438/700; 438/706; 438/717; 438/725
(58) Field of Search .............................. 216/17, 41, 67; 438/700, 706, 717, 725

(56) References Cited

U.S. PATENT DOCUMENTS

| | | | | |
|---|---|---|---|---|
| 6,030,541 A | * | 2/2000 | Adkisson et al. | 216/51 |
| 6,214,637 B1 | * | 4/2001 | Kim et al. | 438/72 |
| 6,235,587 B1 | * | 5/2001 | Hsaio et al. | 438/258 |
| 6,352,922 B1 | * | 3/2002 | Kim | 438/648 |
| 6,383,939 B1 | * | 5/2002 | Yang et al. | 438/706 |
| 2002/0094688 A1 | * | 7/2002 | Mitsuiki | 438/694 |
| 2002/0151179 A1 | * | 10/2002 | Juengling | 438/701 |

* cited by examiner

*Primary Examiner*—Shamim Ahmed
(74) *Attorney, Agent, or Firm*—Foley & Lardner LLP

(57) ABSTRACT

A method of removing organic anti-reflective coating (ARC) by ashing in an integrated circuit fabrication process can include providing an oxide-nitride-oxide (ONO) stack over a silicon substrate, providing a poly layer over the ONO stack, and patterning spaces in the poly layer using a patterned carbon bilayer ARC layer and a patterned hard-mask layer. The patterned carbon bilayer ARC layer is ashed away before patterning spaces in the poly layer. Ashing the carbon bilayer ARC layer helps prevent damage to the ONO stack, improving the quality of the fabricated device.

19 Claims, 4 Drawing Sheets

APPLICATION OF THE CVD BILAYER ARC AS A HARD MASK FOR DEFINITION OF THE SUBRESOLUTION TRENCH FEATURES BETWEEN POLYSILICON WORDLINES

FIELD OF THE INVENTION

The present invention relates generally to integrated circuits and methods of manufacturing integrated circuits. More particularly, the present invention relates to definition of the subresolution trench features between polysilicon wordlines using the CVD deposited bilayer ARC as a hard mask.

BACKGROUND OF THE INVENTION

Semiconductor devices or integrated circuits (Ics) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask, for a particular pattern. The radiation can be light, such as ultra-violet light, vacuum ultra-violet (VUV) light and deep ultraviolet light. The radiation can also be x-ray radiation, e-beam radiation, etc.

The lithographic photoresist coating is generally a radiation-sensitive coating suitable for receiving a projected image of the subject pattern. Once the image is projected, it is indelibly formed in the coating. The projected image may be either a negative or a positive image of the subject pattern.

Exposure of the lithographic coating through a photomask or reticle causes the image area to become selectively either more or less soluble (depending on the negative or positive photoresist coating) in a particular developer. The more soluble areas are removed in the developing process to leave the pattern image in the coating as less soluble polymer.

The photoresist material or layer associated with conventional lithographic technologies is often utilized to selectively form various IC structures, regions, and layers. Generally, the patterned photoresist material can be utilized to define structures associated with an integrated circuit (IC). A conventional lithographic system is generally utilized to pattern photoresist material to form gate stacks or structures. As the features in semiconductor patterning become smaller and smaller, the photoresist thickness needs to be reduced in order to sustain reasonable aspect ratio. A thinner resist may not be suitable for etch application due to premature resist erosion. This limitation provides a need for the use of hard mask processes.

According to one conventional process, a high temperature oxide (HTO) hard mask is provided above polysilicon/oxide layers to pattern the small trenches between gate stacks. The hard mask must be thin enough so that it can be etched without eroding the patterned photoresist above it. The hard mask must also be thick enough to withstand an etch process that can completely remove uncovered portions of the polysilicon layer. Accordingly, the hard mask must have a precise thickness to appropriately pattern the gate stacks. The removal of the hard mask material after the gate stack is defined is also problematic due to the potential for damage to the exposed underlying material.

An anti-reflective coating (ARC) has been conventionally provided underneath the photoresist material or on top of the hard mask to reduce reflectivity and thereby, reduce resist notching and lifting and variation of critical dimension of the obtained pattern. Generally, the ARC (organic or inorganic) layer is a relatively thin layer which cannot be used as a hard mask because of the limited thickness flexibility due to optical design constrains.

Thus, there is a need to pattern IC devices using non-conventional techniques. Further, there is a need for a process of forming a small subnominal trench in the gate stack that does not require a conventional hard mask step. Yet further, there is a need for a hard mask layer that can function as an anti-reflective coating with enough thickness flexibility to be used as a masking material for trench definition and can be removed from the defined polygate structures without any damage to underlying materials. Even further still, there is a need for a gate mask process that effectively balances optical and etching efficiencies.

Conventionally, a carbon bilayer ARC, such as SiON or SiRN having a thickness of 100 to 600 Angstroms can be used over a high temperature oxide (HTO) hardmask to act as anti-reflective material needed for control of the critical dimensions during lithographic exposures. The ARC materials allow controlled patterning of an underlining HTO hardmask using conventional deep ultraviolet (DUV) photolithographic and dry etch techniques. The DUV photoresist is applied, exposed and developed on top of the ARC layer forming a narrow trench structures in the resist film.

Dry etching the ARC and the underlying HTO hardmask layer transfers narrow space features to the HTO hard mask. After the hardmask is patterned, the remaining resist and the ARC material must be removed to allow the formation of the spacer material which allows further reduction of the narrow space between two structures formed during HTO etch. In conventional processes, the stripping of carbon bilayer ARC by dry etching or conventional wet stripping techniques damages the sensitive underlying, oxide-nitride-oxide (ONO) stack and degrades the quality of the device. The combined HTO and spacer hardmask is used to etch the exposed polysilicon with the intention to form submicron spaces between adjacent poly lines in the core.

Thus, there is a need for a carbon/nitride CVD-bilayer ARC that acts as an anti-reflective coating, hard mask and can be easily stripped without damage to the underlying layer. Further, there is a need to consume the thin resist during the, top nitride etch, and consume the nitride and the some of the carbon layers during HTO hard mask etch such that the remaining carbon ARC can be stripped by plasma ashing, which does not damage the ONO stack. Further, there is a need to use bilayer CVD ARC as it is superior to more conventional organic spin-on ARC because bilayer CVD ARC is conformal, providing a uniform reflectivity everywhere. Even further, there is a need for simultaneous printing of peripheral poly circuitry.

SUMMARY OF THE INVENTION

An exemplary embodiment is related to a method of providing a carbon/nitride CVD bilayer ARC that acts as an anti-reflective coating hard mask and can be easily stripped without damage to the underlying layer. This method can include providing a first layer (e.g., carbon) and a second layer (e.g., nitride) as a CVD bilayer ARC above a desired substrate and patterning spaces in the first layer using a DUV resist and patterning the second carbon layer of the ARC using the first layer as a mask. This method also includes patterning HTO hardmask layer using patterned bilayer ARC as a mask. The remaining carbon ARC layer is ashed away after complete patterning of narrow spaces in the HTO hardmask layer.

Another exemplary embodiment is related to a method of using low energy ashing to reduce damage effects on an oxide-nitride-oxide stack. This method can include providing a photoresist layer above a bilayer anti-reflective coating (ARC) above a hardmask layer above a polysilicon layer above an oxide-nitride-oxide stack above a substrate, patterning trenches in the photoresist layer, patterning the bilayer ARC and the hardmask layer using the patterned photoresist layer and the bilayer ARC as a mask, plasma ashing to remove the remaining bilayer ARC layer, providing spacer material over the patterned hardmask layer, removing portions of the spacer material, and defining spaces in the polysilicon layer using the spacer material and patterned hardmask layer.

Another exemplary embodiment is related to a method of forming spaces in poly wordlines. This method can include providing a carbon-nitride bilayer coating (ARC) over a hardmask layer, patterning the bilayer ARC and the hardmask layer using a photoresist pattern, using the photoresist pattern to etch a top layer in the bilayer ARC, using the top etched layer to transfer a desired pattern into a bottom layer in the bilayer ARC using the bottom layer to transfer the desired pattern into a poly layer and removing the remaining bilayer ARC by ashing, thus providing a method of using the patterned hardmask to form spaces in a poly layer below the patterned hardmask layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
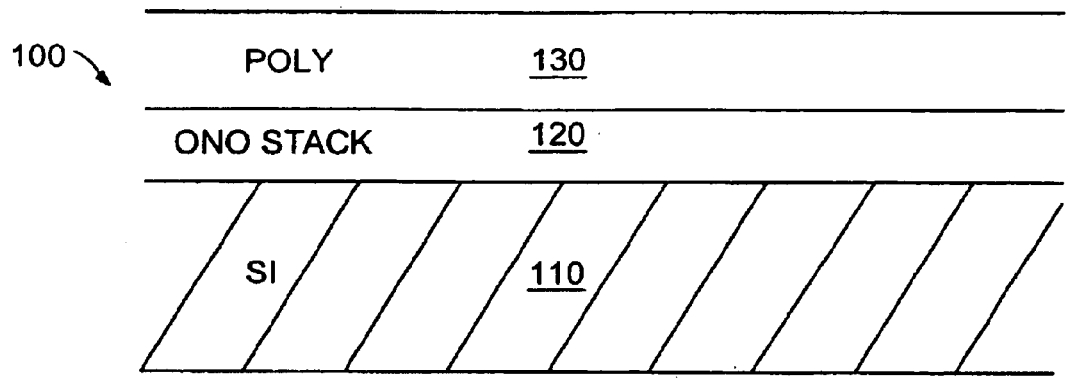
FIG. 1 is a schematic cross-sectional view of a portion of an integrated circuit, showing a poly layer formed over an oxide-nitride-oxide (ONO) stack.

FIG. 1 illustrates a schematic cross-sectional view representation of a portion 100 of an integrated circuit, including a silicon substrate 110, an oxide-nitride-oxide (ONO) stack 120, and a poly layer 130. Portion 100 is preferably part of an ultra-large-scale integrated (ULSI) circuit having millions or more transistors. Portion 100 is manufactured as part of the integrated circuit on a semiconductor wafer, such as a silicon wafer.

As described below, an advantageous process can use an amorphous carbon layer in conjunction with a silicon rich nitride (SiRN) film applied by chemical vapor deposition (CVD). The carbon layer and SiRN layer can be used as anti-reflective coating (ARC) material as well as masking material needed for the patterning of a high temperature oxide (HTO) hardmask used for the definition of spaces in polysilicon word lines.

ONO stack 120 can be multiple layers of dielectric materials, such as silicon oxide and silicon nitride. In an exemplary embodiment, ONO stack 120 has a thickness of 30–100 Angstroms for each oxide nitride oxide layer. ONO stack 120 can include 1–5 layers. ONO stack 120 can be located above silicon substrate 110 and below poly layer 130. ONO stack 120 can be deposited by any of a variety of deposition processes. In an exemplary embodiment, poly layer 130 has a thickness of 500–1000 Angstroms and is deposited by conventional deposition techniques. Poly layer 130 can be polysilicon.

Figure 2:
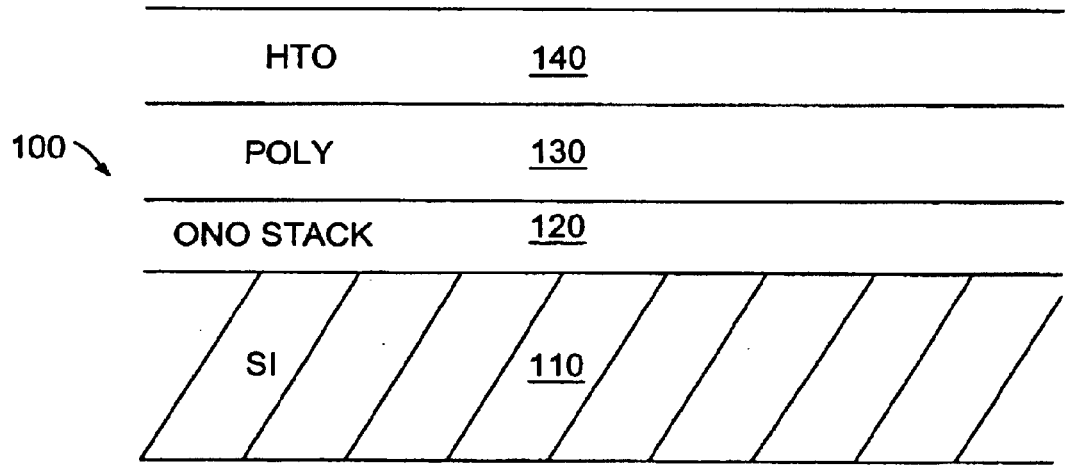
FIG. 2 is a schematic cross-sectional view of a portion of an integrated circuit, showing a high temperature oxide (HTO) silicon oxide ($SiO_2$) hardmask formed over a poly layer.

FIG. 2 illustrates portion 100 described with reference to FIG. 1 with the addition of a high temperature oxide (HTO) $SiO_2$ hardmask layer 140 formed over poly layer 130. In an exemplary embodiment, $SiO_2$ hardmask layer 140 has a nominal thickness of 300 to 1000 Angstroms. $SiO_2$ hardmask layer 140 can be deposited over poly layer 130 by conventional deposition techniques.

Figure 3:
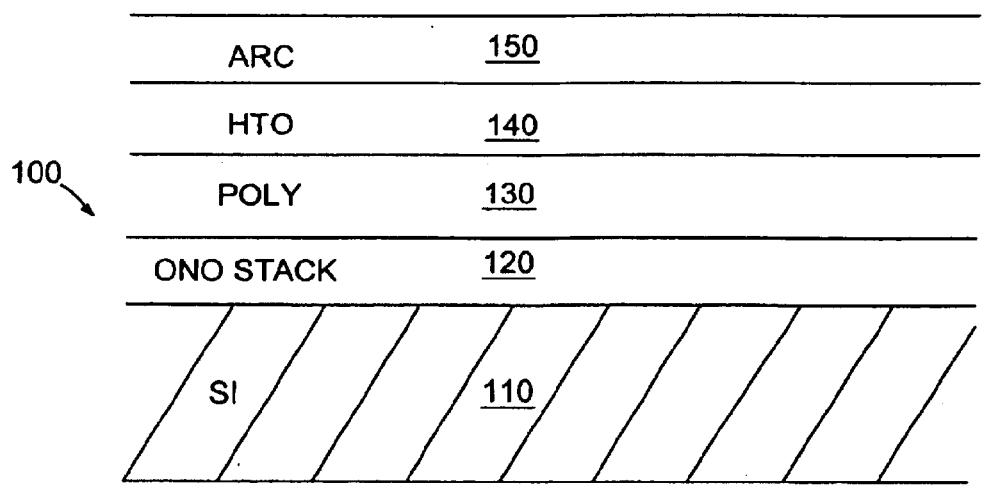
FIG. 3 is a schematic cross-sectional view of a portion of an integrated circuit, showing an chemical vapor deposition (CVD) bilayer anti-reflective coating (ARC) formed over a hardmask.

FIG. 3 illustrates portion 100 described with reference to FIGS. 1-2 with the addition of an carbon-nitride bilayer chemical vapor deposition (CVD) anti-reflective coating (ARC) 150 provided over $SiO_2$ hardmask layer 140. In an exemplary embodiment, bilayer CVD ARC 150 can have a thickness of 300–1000 Angstroms of carbon ARC and 100–500 Angstroms of nitride and is deposited by a CVD deposition technique.

Bilayer CVD ARC 150 can have selectively chosen thickness designed for optical properties needed to provide good critical dimension (CD) control. Further, thickness can be selected based on the erosion rates during etch of the hard mask. For example, in an exemplary embodiment, the top nitride layer of bilayer ARC 150 should be thin enough to withstand the carbon layer patterning and to erode away during HTO hard mask etch, thus allowing the remaining carbon ARC to be stripped with oxygen plasma which does not damage the underlying poly layer 130 and ONO stack 120.

Figure 4:
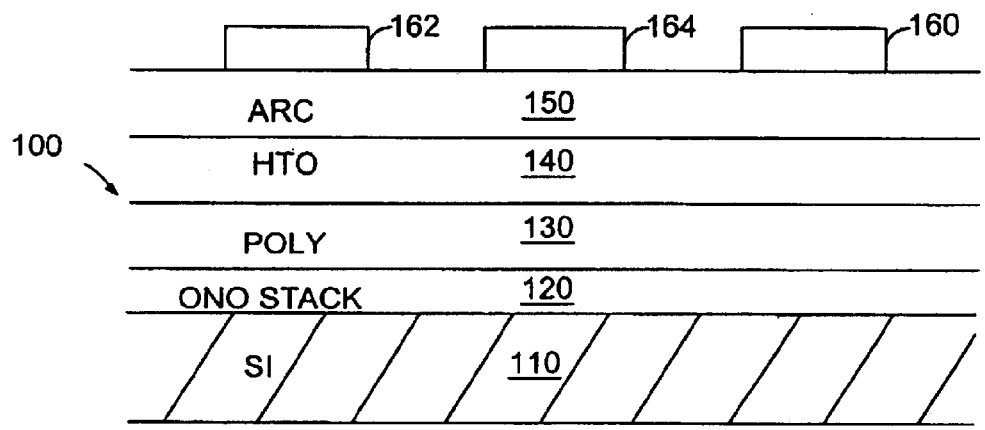
FIG. 4 is a schematic cross-sectional view of a portion of an integrated circuit, showing a photoresist deposited and imaged to form narrow trenches.

FIG. 4 illustrates portion 100 described with reference to FIGS. 1-3 with the addition of a photoresist layer 160 provided over bilayer CVD ARC 150 and patterned to form trenches 162 and 164. Trenches 162 and 164 can have widths of 140–100 nm. Photoresist layer 130 can be deposited by conventional spin application methods and imaged by KRF (DUV) or ARF radiation of the photoresist material.

Figure 5:
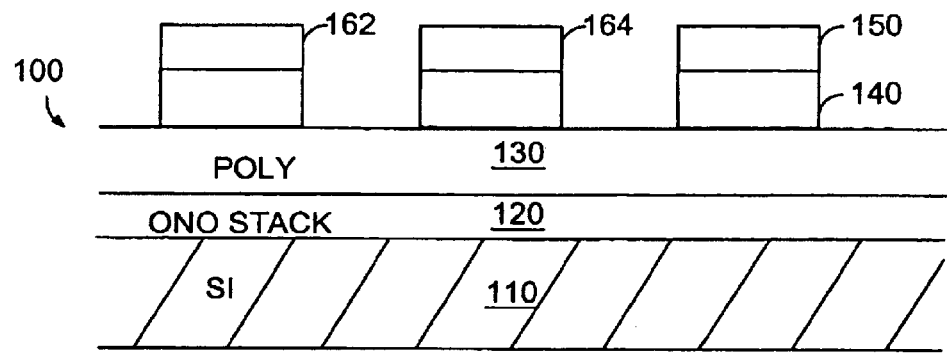
FIG. 5 is a schematic cross-sectional view of a portion of an integrated circuit, showing resist used as mask for etching of a bilayer CVD ARC and HTO hardmask in which a top layer of the bilayer ARC is eroded away during a HTO hardmask etch leaving remaining carbon layer exposed.

FIG. 5 illustrates portion 100 described with reference to FIGS. 1-4 in which patterned photoresist layer 160 is used as a mask for an etch of bilayer CVD ARC 150 and $SiO_2$ hardmask layer 140. The etch of bilayer CVD ARC 150 and $SiO_2$ hardmask layer 140 removes material below trenches 162 and 164. Thus, removed portions of bilayer CVD ARC 150 and $SiO_2$ hardmask layer 140 can have a width of approximately 100–40 nm where trenches 162 and 164 have widths of 100–140 nm.

Figure 6:
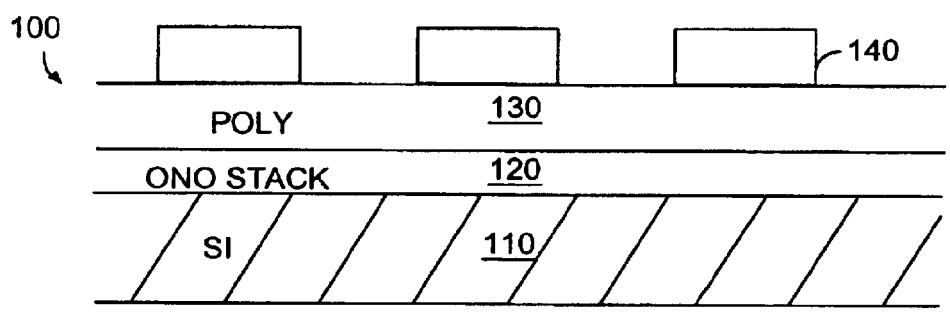
FIG. 6 is a schematic cross-sectional view of a portion of an integrated circuit, showing that a carbon layer on top of the HTO hardmask is ashed away to leave a patterned hardmask without damage to doped polylayer and ONO stack.

FIG. 6 illustrates portion 100 described with reference to FIGS. 1-5 in which photoresist layer 160 and the top layer of the bilayer CVD ARC are eroded during the $SO_2$ hardmask etch and remaining second layer of the bilayer ARC 150 is ashed away. Ashing is a procedure by which the carbon layer of the bilayer CVD ARC 150 can be removed or stripped without damaging the underlying poly or the ONO stack 120. Ashing can involve introduction of a plasma of $O_2$ ions. After the plasma ashing procedure, a patterned $SiO_2$ hardmask layer 140 remains over poly layer 130.

In an exemplary embodiment, ashing can be performed in a non-oxygen gas or trace oxygen forming gas plasma process. Portion 100 is exposed to an $O_2$ plasma that selectively removes photoresist layer 160 without damaging polysilicon and ONO stack 120. In a preferred embodiment, the plasma used is non-oxygen forming gas plasma. For example, in a preferred embodiment a non-oxygen forming gas plasma may be used that contains up to 20% of combined hydrogen gas ($H_2$) and nitrogen gas ($N_2$).

Figure 7A:
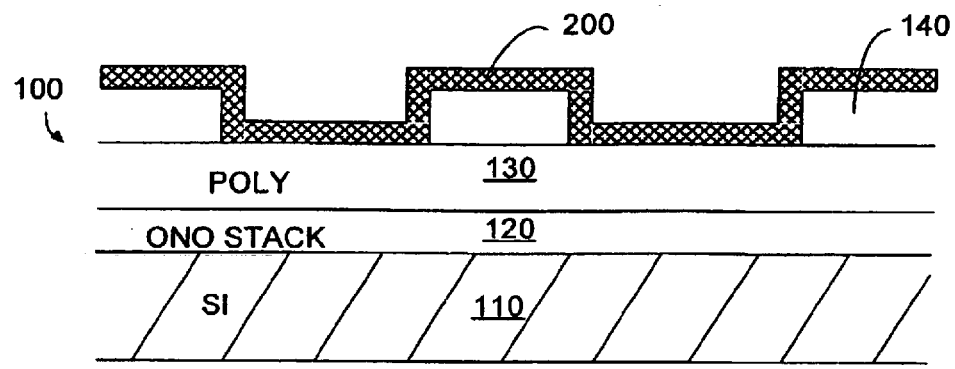
FIG. 7A is a schematic cross-sectional view of a portion of an integrated circuit, showing an oxide-based spacer or hardmask material deposited over a patterned hardmask.

FIG. 7A illustrates portion 100 described with reference to FIGS. 1-6 in which an oxide-based spacer hardmask material 200 is deposited over $SiO_2$ hardmask layer 140. Spacer hardmask material 200 is to conformally cover the $SiO_2$ hardmask layer 140, as well as lateral side walls and the bottoms of trenches 210 formed in the patterning of $SiO_2$ hardmask layer 140. In an exemplary embodiment, spacer hardmask material 200 can have a thickness of 20–100 Angstroms. Spacer hardmask material 200 can include materials, such as $SiO_2$.

Figure 7B:
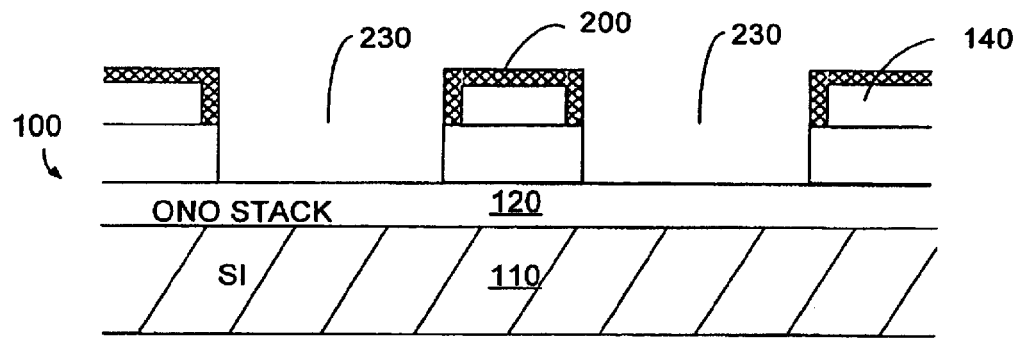
FIG. 7B is a schematic cross-sectional view of a portion of an integrated circuit, showing spaces formed in a poly layer in accordance with an exemplary embodiment.

FIG. 7B illustrates portion 100 described with reference to FIGS. 1-7A with the addition of trenches 230 formed in poly layer 130. In an exemplary embodiment, trenches 230 have a width of 50 to 70 Angstroms. Trenches 230 are defined in part using a high temperature oxide (HTO) and a spacer hardmask material 200. The purpose of trenches 230 is to form a subresolution spaces between two adjacent poly wordlines.

After etching of the poly layer 130 using layer 140, hardmask layer 140 and spacer hardmask material 200 are removed from the polysilicon using acid bath dips.

Advantageously, a carbon/nitride CVD bilayer ARC in this exemplary embodiment acts as a anti-reflective coating hard mask and can be easily stripped without damage to the underlying layers. The stripping of the CVD bilayer ARC is possible because the thin resist is consumed during the top nitride etch, the nitride and the some of the carbon layers are consumed during HTO hard mask etch, and the remaining carbon ARC is stripped by plasma ashing which does not damage the underlying poly and an ONO stack. Further, the use of the bilayer CVD ARC is superior to more conventional organic spin-on ARC because bilayer CVD ARC is conformal, providing a uniform reflectivity control that in turn provides tight CD control of the described method. Further, the method described with references to FIGS. 1-7B includes the ability to remove the remaining ARC material using ashing process as opposed to a conventional SiON ARC dry etch which causes damage to the underlying layers. Use of low-energy ashing does not damage the polysilicon or the ONO layers used to store charge in flash memory devices. As such, the reliability of dual-bit flash devices can be improved.

While the exemplary embodiments illustrated in the FIGURES and described above are presently preferred, it should be understood that these embodiments are offered by way of example only. Other embodiments may include, for example, different material layers as well as additional or combined steps in the process. The invention is not limited to a particular embodiment, but extends to various modifications, combinations, and permutations that nevertheless fall within the scope and spirit of the appended claims.

What is claimed is:

1. A method of providing a carbon/nitride bilayer anti-reflective coating (ARC) that can be stripped without damage to an underlying layer, the method comprising:
   providing a first layer and a second layer as a bilayer ARC above a substrate;
   patterning spaces in the first layer and patterning the second layer using the patterned first layer as a mask; and
   ashing away the remaining patterned bilayer ARC layer after patterning of spaces wherein layers underlying the bilayer ARC are protected from damage.

2. The method of claim 1, wherein the bilayer ARC is deposited over a $SiO_2$ hardmask layer using chemical vapor deposition (CVD) and patterned using a patterned photoresist layer with trenches.

3. The method of claim 2, wherein the trenches have widths of approximately 100–140 nm.

4. The method of claim 1, wherein patterning spaces includes using a patterned hardmask layer.

5. The method of claim 4, wherein the patterned hardmask layer is a high temperature oxide (HTO) $SiO_2$ hardmask.

6. The method of claim 1, wherein patterning spaces in the first layer and patterning the second layer using the patterned first layer as a mask comprises patterning a bilayer ARC and a hardmask layer using a photoresist layer having trenches.

7. The method of claim 6, wherein the hardmask layer is a high temperature oxide (HTO) $SiO_2$ hardmask layer.

8. The method of claim 1, wherein the underlying layers comprise an oxide-nitride-oxide (ONO) stack.

9. The method of claim 8, wherein the thickness of the bilayer ARC layer is 300–1000 Angstroms for a carbon layer and 100–500 Angstroms for a nitride layer.

10. A method of using low energy ashing to reduce damage effects on an oxide-nitride-oxide stack, the method comprising:
    providing a photoresist layer above a carbon-nitride bilayer anti-reflective coating (ARC) above a hardmask layer above a polysilicon layer above an oxide-nitride-oxide stack above a substrate;
    patterning trenches in the photoresist layer;
    patterning the bilayer ARC and the hardmask layer using the patterned photoresist layer as a mask;
    plasma ashing to remove patterned bilayer ARC;
    providing spacer material over the patterned hardmask layer;

removing portions of the spacer material; and defining spaces in the polysilicon layer using the spacer material and patterned hardmask layer.

11. The method of claim 10, wherein the bilayer anti-reflective coating (ARC) has a thickness selected for critical dimension control.

12. The method of claim 10, wherein the hardmask layer is a high temperature oxide (HTO) $SiO_2$ layer having a nominal thickness of approximately 600 Angstroms.

13. The method of claim 10, wherein the spaces defined in the polysilicon layer are 50 to 70 Angstroms in width.

14. A method of forming spaces in poly wordlines, the method comprising:

providing a carbon-nitride bilayer anti-reflective coating (ARC) over a hardmask layer;

patterning the bilayer ARC and the hardmask layer using a photoresist pattern;

removing the bilayer ARC by ashing wherein layers underlying the bilayer ARC are protected from damage; and using the patterned hardmask layer to form spaces in a poly layer below the patterned hardmask layer.

15. The method of claim 14, further comprising depositing spacer material over the patterned hardmask layer to help define spaces in the poly layer.

16. The method of claim 14, wherein the bilayer ARC has a thickness necessary for critical dimension (CD) control.

17. The method of claim 16, wherein the thickness of the bilayer ARC is between 400 and 1500 Angstroms.

18. The method of claim 14, wherein the poly layer is above an oxide-nitride-oxide (ONO) stack.

19. The method of claim 14, wherein the spaces have a width of between 50 and 70 Angstroms.

* * * * *